March 25, 1958 | G. A. KWASNIEWSKI | 2,827,631

DETACHABLE BENDING FINGERS

Filed Dec. 3, 1956 | 2 Sheets-Sheet 1

INVENTOR.

GEORGE A. KWASNIEWSKI

BY Robert E. Horne

ATTORNEY

March 25, 1958 G. A. KWASNIEWSKI 2,827,631

DETACHABLE BENDING FINGERS

Filed Dec. 3, 1956 2 Sheets-Sheet 2

INVENTOR.
GEORGE A. KWASNIEWSKI
BY Robert E. Horne
ATTORNEY

United States Patent Office 2,827,631

Patented Mar. 25, 1958

2,827,631

DETACHABLE BENDING FINGERS

George A. Kwasniewski, Minneapolis, Minn., assignor to General Mills, Inc., a corporation of Delaware Application December 3, 1956, Serial No. 625,806

5 Claims. (Cl. 1—2)

This invention relates to improvements in apparatus for automatically attaching electrical components to a printed circuit board and more specifically to detachable bending fingers for bending and inserting the leads of an electrical component to a circuit board.

The attachment of electrical components having coaxial leads to a printed circuit board is done by bending the leads substantially normal to their coaxial position and inserting them into openings in the circuit board. In the assembly of components in a particular circuit board, many types and sizes of components may be required for the particular circuit involved and thus it is advantageous that the apparatus for bending and inserting the coaxial leads of a component be adaptable and detachable to handle various sizes and types of components to be attached to the board.

It is therefore an object of my invention to provide apparatus for attaching electrical components to a circuit board wherein said apparatus is provided with detachable bending fingers for bending and inserting the leads of an electrical component.

Another object of my invention is to provide detachable bending fingers which may be easily removed and replaced with other bending fingers for bending and inserting other sizes or types of components.

Other objects and advantages will become apparent in the following specification in connection with the appended drawings in which.

The preferred embodiment of my invention concerns the attachment of a resistor type electrical component having coaxial leads, but said invention may operatively attach other types of electrical components having coaxial leads.

Figures 1, 2:
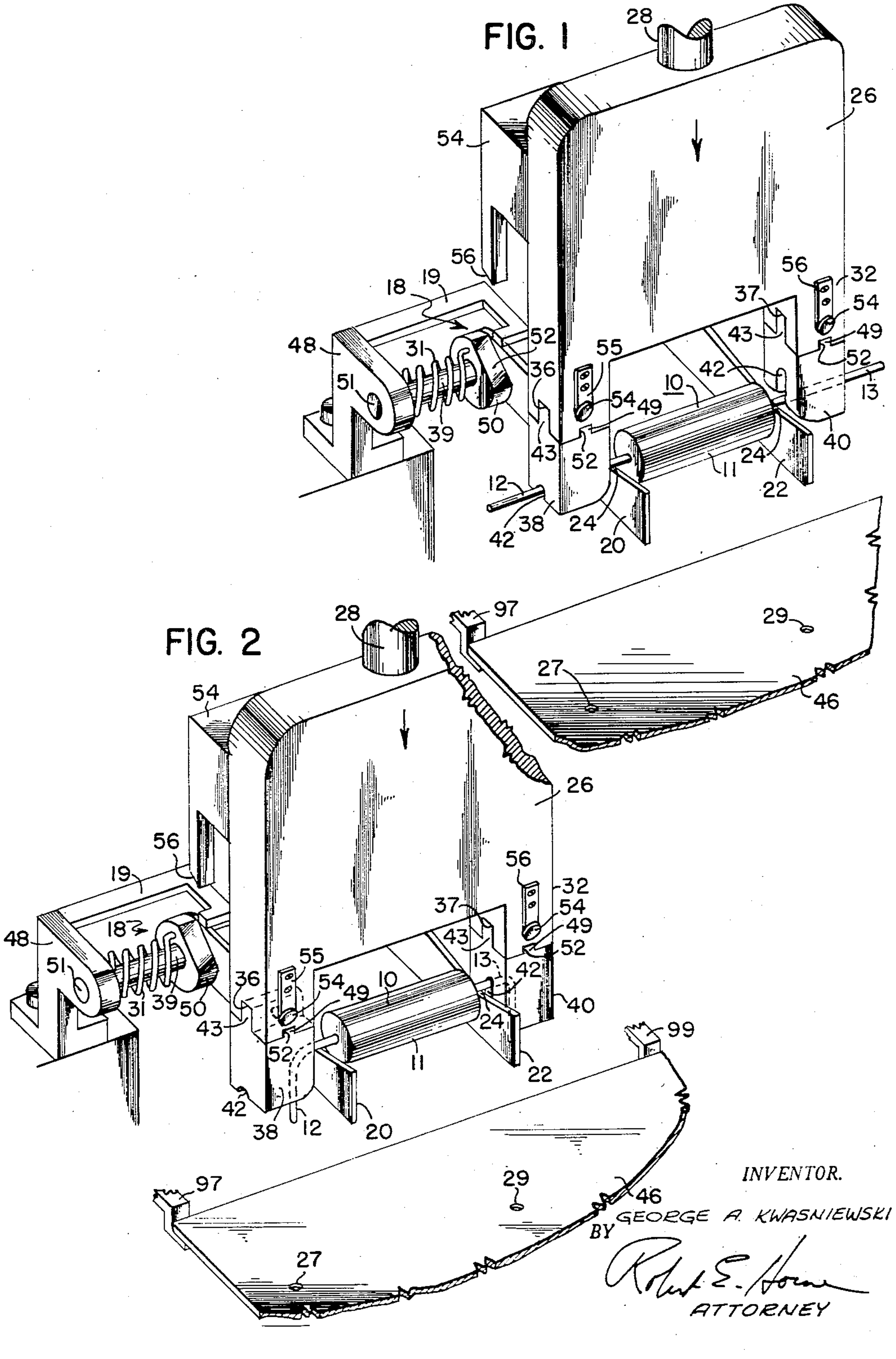
Figure 1 is an isometric of the inserter head with detachable bending fingers in position prior to the bending of the component leads.
Fig. 2 is an isometric similar to Fig. 1 showing the position of the inserter head after the leads have been bent.

Referring now to Fig. 1, the resistor 10 comprises a cylindrical body portion 11 with coaxial leads 12 and 13 extending from the body portion. The resistor 10 is supported in notches 24 of anvil members 20 and 22, and the leads 12 and 13 are bent downwardly by the action of the inserter head 26 and bending fingers 38 and 40 passing outwardly of members 20 and 22. Motion for the inserter head 26 is provided by a pusher rod 28 which is operatively connected to the piston of an air cylinder (not shown but which is substantially the same as that shown in the Kwasniewski et al. application Serial No. 519,871, filed July 5, 1955, and assigned to the same assignee), the pusher rod 28 being attached to the uppermost portion of inserter head 26.

For bending the leads 12 and 13 of the resistor 10, a pair of detachable bending fingers 38 and 40 detachably secured to inserter head 26 are moved downwardly with the positioning of inserter head 26 by pusher rod 28 to engage leads 12 and 13. Bending fingers 38 and 40 are provided with a central grooved portion 42 to form the contact surface of the bending fingers with the leads to be bent.

Figures 3, 4, 5, 6:
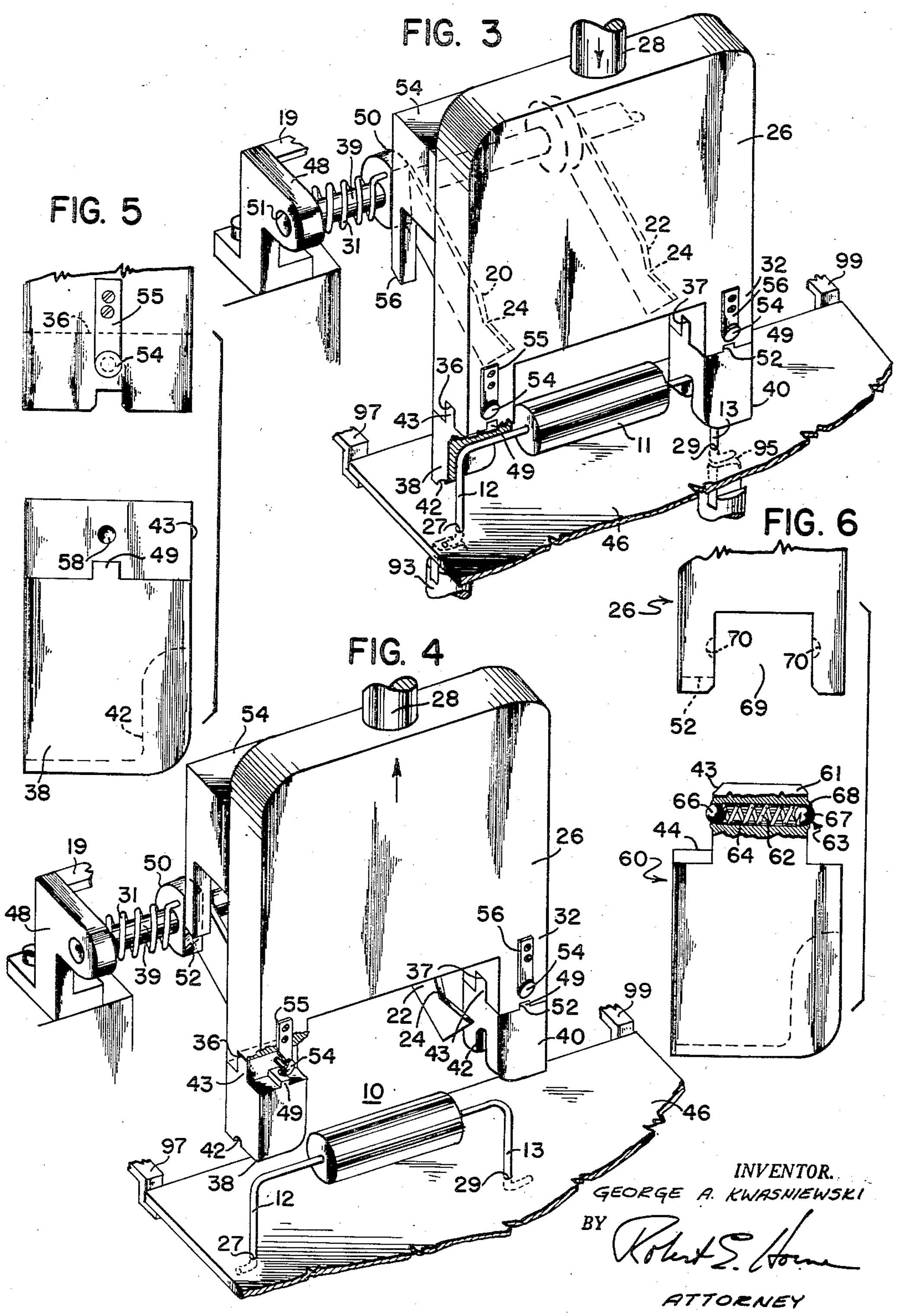
Fig. 3 is an isometric showing the insertion of the component into the circuit board.
Fig. 4 is an isometric of the inserter head after component insertion.
Fig. 5 is a side elevational view of the detachable bending finger and locking device.
Fig. 6 is a side elevational view of a portion of the bending finger having a different embodiment of the locking device.

The upper ends of the bending fingers 38 and 40 are provided with extended tongue portions 43 which fit into grooves 36 and 37 in the lower portion of the inserter head 26. The tongue portions 43 are substantially centrally located with respect to the lower portion of the bending fingers 38 and 40 and extend laterally across the upper portions of the bending fingers. Referring to Fig. 5, the bending fingers 38 and 40 are provided with an additional vertically extending tab portion 49 located at the upper end of said bending fingers and normal to tongue portions 43. These tab portions 49 extend into grooves 52 when the bending fingers 38 and 40 are in position to bend the leads 12 and 13 of resistor 10. For retention of the inserting fingers 38 and 40, the lower end of the inserter head is provided with a locking means consisting of a pair of spring loaded locking pins 54. The pins 54 are secured to the lower end of leaf springs 55 and 56 which are mounted to inserter head 26. The locking pins 54 extend into horizontal openings in the inserter head and into grooves 36 and 37. Upon insertion of the bending fingers 38 and 40, the locking pins 54, which extend into grooves 36 and 37, bear upon the side surfaces of the tongue 43 by virtue of the leaf springs 55 and 56. Therefore, to complete the locking action, detent notches 58 are provided in the tongues 43 for engaging the fore-ends of locking pins 54 when the bending fingers 38 and 40 are properly inserted. Thus the bending fingers 38 and 40 and retained until the locking pins 54 are manually released from the locking position. It can now be seen that a bending finger having identical aligning and locking means, but adaptable to bend and insert different sizes or types of components may be attached to the inserter head 26.

Referring now to Fig. 6, another embodiment of the present invention is shown wherein the bending finger designated generally by the numeral 60 is provided with a snap locking arrangement mounted in the tongue portion 43 and consisting of a spring and ball device 63. The spring 62 located in a tubular opening 64 forces the balls 66 and 67 outward against a peened or crimped retainer portion 68. It will be noted that the outwardly extending surfaces of the balls extend slightly beyond the outer surface of the tongue 43. Upon insertion of the tongue 43 into the groove 69 of the inserter head 26 the balls 66 and 67 become engaged in detent notches 70 and retain the finger in an attached position. The finger 60 may become disengaged by manually applying a downward force to overcome that of the spring 62 and thereby release the bending finger 60 from its engaged position. Also located on the bending finger 60 is a positioning tab 44 which is identical to the one shown on fingers 38 and 40 and therefore serves the identical function to positively provide lateral positioning to the bending finger 60.

Referring now to the operation of the machine, with the descent of inserter head 26, the lead bending fingers 38 and 40 engage the coaxial leads 12 and 13 of the component 10 as shown in Fig. 1 with the grooves 42 of the bending fingers 38 and 40. The bending fingers 38 and 40 are spaced so that they pass exterior of the support members 20 and 22 of the anvil.

The support members 20 and 22 of the anvil 18 are held in a support position by a spring 31 which biases the support members 20 and 22 upward to support the component 10 in a horizontal position until the leads 12 and 13 are bent. A stop lug 19 is provided to retain the anvil 18 in a support position.

As the inserter head 26 moves downwardly, the leads 12 and 13 are bent downward to that of the position shown in Fig. 2.

When the leads 12 and 13 have been bent and the inserter head 26 has moved to the position shown in Fig. 2, it continues its downward travel to carry the resistor 10 to the circuit board 46, which is in position beneath the anvil 18. The anvil member 18 is moved out of the path of the inserter head 26 as it moves downward in a vertical path. As will be noted in Figs. 1 through 4, the anvil 18 is pivotally mounted on support brackets 48 and is capable of swinging rearwardly away from the inserter head 26 except for the tension of the spring 31 which retains it in a support position. For the purpose of tilting the anvil 18 out of the path of the inserter head 26, a cam plate 50 is provided, having an inclined surface 52.

Mounted to the rear of the inserter head 26 and extending downward therefrom is a cam actuating arm 54 having an inclined surface 56. As the inserter head 26 moves to the position shown in Fig. 3, the actuating arm 54 which is offset from the axis of the anvil support shaft 39, comes to bear upon the inclined surface 52 of the cam plate 50 and as the inserter head 26 continues its downward movement the anvil 18 and its support members 20 and 22 are swung rearwardly to a position out of the path of the inserter head 26.

The inserter head 26, continuing downward, inserts the leads 12 and 14 into openings 27 and 29 of the circuit board 46 which is supported by members 97 and 99. At this time the bending fingers 38 and 40 are resting against the circuit board and a crimping means having crimping fingers 93 and 95 (not shown in detail) moves upward to crimp a portion of the leads 12 and 13 against the underside of the circuit board 27. The crimping member may be of the type seen in application Serial No. 515,742 filed June 15, 1955, and assigned to the same assignee.

The inserter head is then retracted leaving the component 10 attached to the circuit board by virtue of the crimped portion of the leads 12 and 13.

As the inserter head 26 is retracted to its uppermost position of Fig. 1, the cam arm 54 permits the anvil 18 to again move to a component supporting position, and upon receiving another component the sequence of operation is ready to be repeated.

I have, in the drawings and specification, presented a detailed disclosure of the preferred embodiment of my invention. It is to be understood that the invention is subject to change and modification and it is therefore not intended to limit the scope of the invention to the specific form disclosed but to cover all modifications and alternatives falling within the principles taught by the invention.

Now, therefore, I claim:

1. In a mechanism for attaching electrical components having coaxial leads to a circuit board, a supporting anvil, a circuit board subjacent said supporting anvil, an inserting head superjacent said supporting anvil and having movement to and from said supporting anvil and said circuit board, means on said inserting head to engage and bend the leads of a component while said component is supported on said supporting anvil, means on said inserting head to move said supporting anvil out of the path of said inserting head subsequent to the bending of said leads, said inserting head and said lead bending means coacting to attach said leads to said circuit board, the improvement comprising; a pair of detachable lead bending fingers, means on said lead bending fingers to engage said inserting head, said engaging means includes a vertically extending tongue on said bending fingers, a recessed detent notch in one side surface of said tongue, and a vertically extending locating tab on said bending fingers normal to said tongue.

2. The combination of claim 1 including a mating means on said inserting head for receiving said engageable means of said bending fingers, and means on said inserting means to releasably retain said bending fingers thereto.

3. An inserting head as described in claim 2, wherein said mating means on said inserting head includes; a pair of vertically recessed slots, said slots spaced apart on the lower surface of said inserting head, said lower surface of said inserting head provided with a pair of additional vertical recesses, at substantially a right angle near said slots, said inserting member provided with a pair of laterally extending openings, one of said openings extending into each of said slots and normal thereto, a leaf spring mounted on said inserting member, one above each of said holes, said leaf springs extending toward and provided with a laterally extending locking pin thereon, said pins extending into said openings of said vertical slots.

4. An inserting head as described in claim 2, wherein said mating means on said inserting head includes; a pair of vertically recessed slots, said slots spaced apart on the lower surface of said inserting head, each of said slots provided with a pair of recessed detent notches generally near the top of and on the inside opposing side surfaces of said slots, said mating means also having a vertically extending opening on said inserting head normal to said vertical slot.

5. A detachable bending finger as described in claim 1, wherein said engageable means includes; a vertically extending tab portion, a vertically extending tongue normal to said tab, said tongue provided with a horizontal opening relatively near its upper end, said opening having a pair of outwardly projecting balls, said balls biased outward by a spring interposed therebetween, said balls extending partially beyond the vertical side surfaces of said tongue, and a peened surface of said horizontal opening retaining said balls.

References Cited in the file of this patent

UNITED STATES PATENTS

| | | |
|---|---|---|
| 2,216,453 | Paulin | Oct. 1, 1940 |
| 2,705,797 | Handel | Apr. 12, 1955 |